(12) United States Patent
Mayama et al.

(10) Patent No.: US 7,046,073 B2
(45) Date of Patent: May 16, 2006

(54) LOAD DRIVE CIRCUIT

(75) Inventors: Shuji Mayama, Mie (JP); Isao Isshiki, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 161 days.

(21) Appl. No.: 10/776,613

(22) Filed: Feb. 12, 2004

(65) Prior Publication Data

US 2004/0228058 A1   Nov. 18, 2004

(30) Foreign Application Priority Data

Feb. 14, 2003 (JP) .......................... P2003-037246

(51) Int. Cl.
*H03K 17/687* (2006.01)

(52) U.S. Cl. ...................................... 327/434; 327/108

(58) Field of Classification Search ................ 327/434, 327/376, 377
See application file for complete search history.

(56) References Cited

U.S. PATENT DOCUMENTS

| 6,313,690 B1 * | 11/2001 | Ohshima | 327/427 |
| 6,377,428 B1 | 4/2002 | Ogasawara | 326/86 |
| 6,661,260 B1 * | 12/2003 | Nakahara et al. | 327/109 |

FOREIGN PATENT DOCUMENTS

JP    A 2000-312433    11/2000

* cited by examiner

*Primary Examiner*—Long Nguyen
(74) *Attorney, Agent, or Firm*—Oliff & Berridge, PLC

(57) ABSTRACT

A load drive circuit includes a plurality of control sections for drive controlling of a drive switching element while protecting the drive switching element from a predetermined abnormality status, and a current blocking switching element being provided in at least any of a path between the control sections and a power source and a path between the control sections and a ground. When an input to an input circuit is OFF, a current flowing to a gate drive circuit for on/off driving of the drive switching element becomes an OFF state, the driving switching element becomes an OFF state, and the input circuit causes each current blocking switching element to be an OFF state to block dark current.

18 Claims, 3 Drawing Sheets

LOAD DRIVE CIRCUIT

BACKGROUND OF THE INVENTION

1. Field of the Invention

The present invention relates to a load drive circuit for switching on/off of a load to be driven.

2. Description of the Related Art

An automobile includes various in-vehicle loads (such as those engine-related, electric-related, information-related). In particular, recent developments in electronics have allowed various electronic units or the like to be loaded in an automobile as an in-vehicle load.

Furthermore, conventional various overcurrent protection has been provided by setting up a fuse 4 as shown in FIG. 2 on a current path 3 that connects a load 1 with a power source 2 (conventional technique 1). In FIG. 2, reference numeral 5 denotes a mechanical relay.

However, the use of the fuse 4 as shown above for overcurrent protection requires, whenever this fuse 4 fails, another operation in which the fuse is exchanged with a new one. Additionally, in general, there have been used a unit-type fuse box including a plurality of fuses 4. However, this fuse box has a large volume and occupies more space, thus reducing space for other in-vehicle electrical components. Such a fuse box is also limited in its mounting position because the fuse 4 must be exchanged with a new one.

In view of the above, there has been another kind of load drive circuit using a semiconductor relay instead of the fuse box.

Specifically, the semiconductor relay is used in two ways as shown below.

One way is that an overcurrent is detected by a shunt resistance or a sense MOS-FET or the like and the detected overcurrent is determined by a microcomputer or an external circuit (conventional technique 2). In this case, rush current is taken care by changing the reference voltage of the external circuit or by a software program of the microcomputer.

The other way is that a self protection type Intelligent Power Device (IPD) 6 as shown in FIG. 3 is used that has a current detection function and a determination function (conventional technique 3).

The IPD 6 of this conventional technique 3 has a self protection type overcurrent protection function as shown in FIG. 4 that works, when a load drive circuit itself has therein an overcurrent or overtemperature, to detect the overcurrent or overtemperature to block the current. In this case, the fuse 4 in FIG. 3 may be eliminated.

When the on/off switching of driving to the load 11 is provided by a drive switching element (a first switching element) 12 consisting of FET, this IPD 6 as shown in FIG. 4 controls the ON/OFF state of this drive switching element 12 and provides current protection of the drive switching element 12.

Specifically, when an operator uses the operation switch 13 to provide an on/off switching operation, the ON/OFF state of the operation switch 13 is detected by the input circuit 15. When the input circuit 15 detects the ON state of the operation switch 13, the protection circuit 21 and the gate drive circuit 23 are provided with the power source (+B) 19, thereby starting the operation.

The gate drive circuit 23 is called a charge pump that uses, in order to allow the gate of the drive switching element 12 to have a higher electric potential than that of the source, an N channel FET and a oscillation capacitor or the like to increase the voltage of the power source (+B) 19 (for example, to double the voltage).

The current limitation circuit 25 determines whether the voltage decline between the drain and the source of the drive switching element 12 exceeds a predetermined threshold value or not. When the voltage decline between the drain and the source of the drive switching element 12 exceeds the predetermined threshold value, the current limitation circuit 25 then causes the gate and the source to have therebetween a short circuit to reduce the input voltage to the gate, thereby reducing the current flowing in the drive switching element 12.

This IPD 6 has a overcurrent detection circuit 29 for detecting an overcurrent to report information to the protection circuit 21 and an overheat detection circuit 31 for detecting an overtemperature to report information to the protection circuit 21. When the overcurrent detection circuit 29 detects an overcurrent or when the overheat detection circuit 31 detects an overtemperature, then the protection circuit 21 blocks or intermittently stops via the gate drive circuit 23 the supply of the gate voltage to the drive switching element 12, thereby adjusting the current and temperature.

These conventional techniques 2 and 3 significantly reduce the conventional number of times for which the fuse 4 is exchanged with a new one, thus reducing manhours accordingly. These conventional techniques 2 and 3 can also eliminate the fuse box itself and thus provide more mounting space for other components.

For reference, JP-A-2000-312433 discloses a related art.

By the way, the load drive circuit using the conventional IPD 6 had a problem in that, even when the input terminal is in an OFF state and the drive switching element 12 is in an OFF state, power is always supplied to the circuit sections 21, 23, 25, 29, and 31 in the load drive circuit to be in an active status, thus these circuit sections 21, 23, 25, 29, and 31 always have therein current. This current causes a dark current, thus causing a device such as an in-vehicle electrical component driven by a battery to have a reduced battery life.

SUMMARY OF THE INVENTION

Thus, an object of the present invention to provide a load drive circuit that can block the unwanted dark current to prevent the battery from having a reduced life.

In order to solve the above-described problems, a first aspect of the invention includes: a drive switching element for switching on and off a load current that is provided between a load and a power source; a gate drive circuit for on/off driving of the drive switching element; an input circuit for detecting on operation of an external switch; a protection circuit for switching, when the input circuit detects on operation of the switch, the gate drive circuit to be in an ON state and for controlling in accordance with the overcurrent status or the overheat status the gate drive circuit to protect the circuit; and a current blocking switching element for blocking, when a signal inputted from the switch to the input circuit is OFF, a current flowing to the gate drive circuit, the current blocking switching element being provided in at least any of the path between the gate drive circuit and the power source and the path between the gate drive circuit and a ground.

Second and third aspects of the invention include: another current blocking switching element for blocking, when a signal inputted from the switch to the input circuit is OFF, a current flowing to the protection circuit, the current blocking switching element being provided in at least any of the path between the protection circuit and the power source and the path between the protection circuit and a ground.

Fourth and fifth aspects of the invention include: an overcurrent detection circuit for detecting an overcurrent to output the detection result to the protection circuit; and another current blocking switching element for blocking, when a signal inputted from the switch to the input circuit is OFF, a current flowing to the overcurrent detection circuit, the current blocking switching element being provided in at least any of the path between the overcurrent detection circuit and the power source and the path between the overcurrent detection circuit and a ground.

Sixth and seventh aspects of the invention include: an overheat detection circuit for detecting an overheat status to output the detection result to the protection circuit; and another current blocking switching element for blocking, when a signal inputted from the switch to the input circuit is OFF, a current flowing to the overheat detection circuit, the current blocking switching element being provided in at least any of the path between the overheat detection circuit and the power source and the path between the overheat detection circuit and a ground.

Eighth and ninth aspects of the invention include: a current limitation circuit for causing, when the voltage decline between both ends of the drive switching element exceeds a predetermined threshold value, the both ends to have therebetween a short circuit to limit the current flowing to the drive switching element; and a current blocking switching element for blocking, when a signal inputted from the switch to the input circuit is OFF, a current flowing to the current limitation circuit, the current blocking switching element being provided in at least any of the path between the current limitation circuit and the power source and the path on the output terminal side of the current limitation circuit.

Tenth aspect of the invention includes: a drive switching element for switching on and off a load current that is provided between a load and a power source; a plurality of control sections for drive controlling of the drive switching element while protecting the drive switching element from a predetermined abnormality status; and a current blocking switching element for blocking, when a signal inputted from the switch to the input circuit is OFF, a current flowing to the control sections, the current blocking switching element being provided in at least any of the path between at least one of the control sections and the power source and the path between at least one of the control sections and a ground.

DETAILED DESCRIPTION OF PREFERRED EMBODIMENTS

Figure 1:
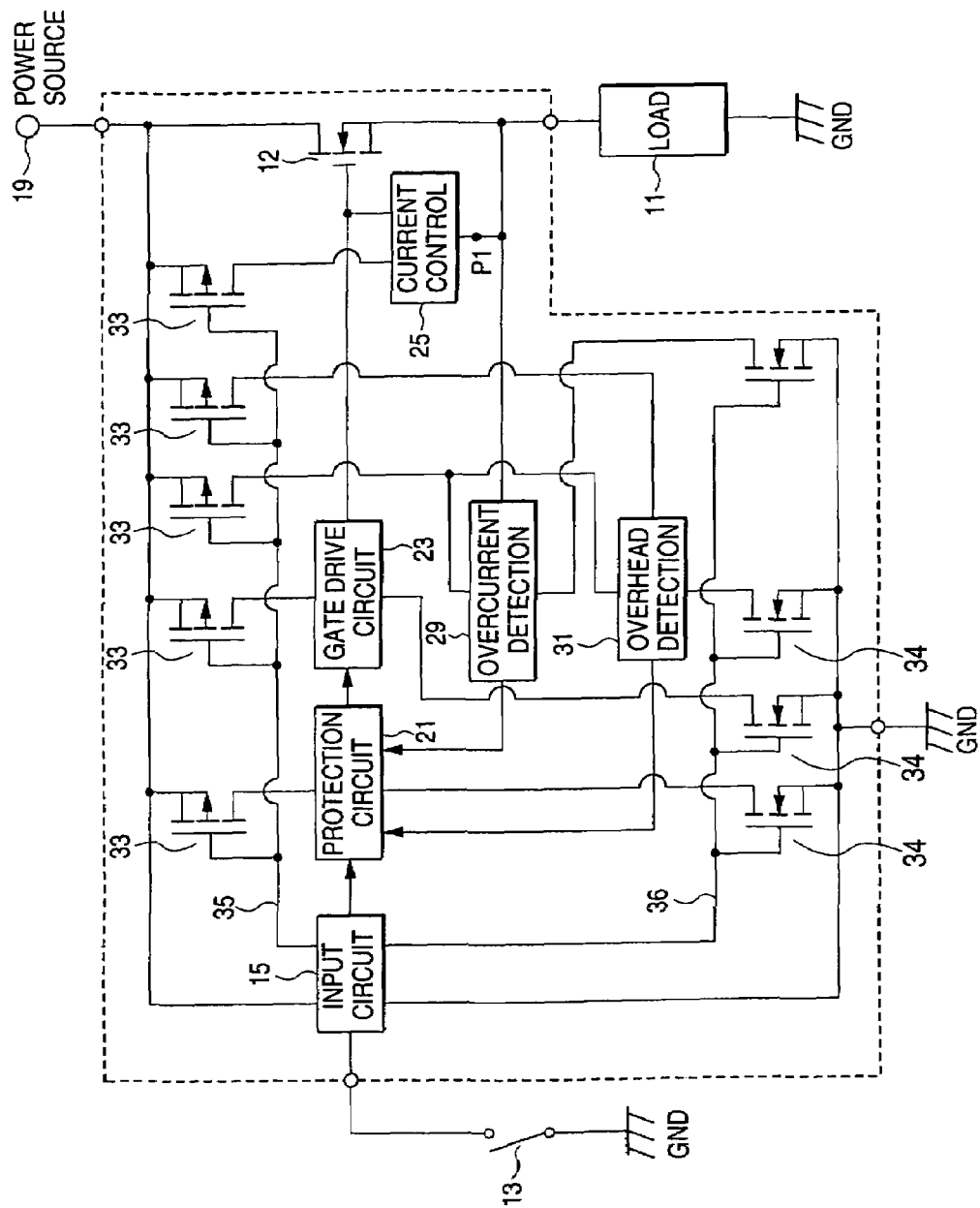
FIG. 1 is a block diagram illustrating a load drive circuit according to one embodiment of the present invention.
Figure 2:
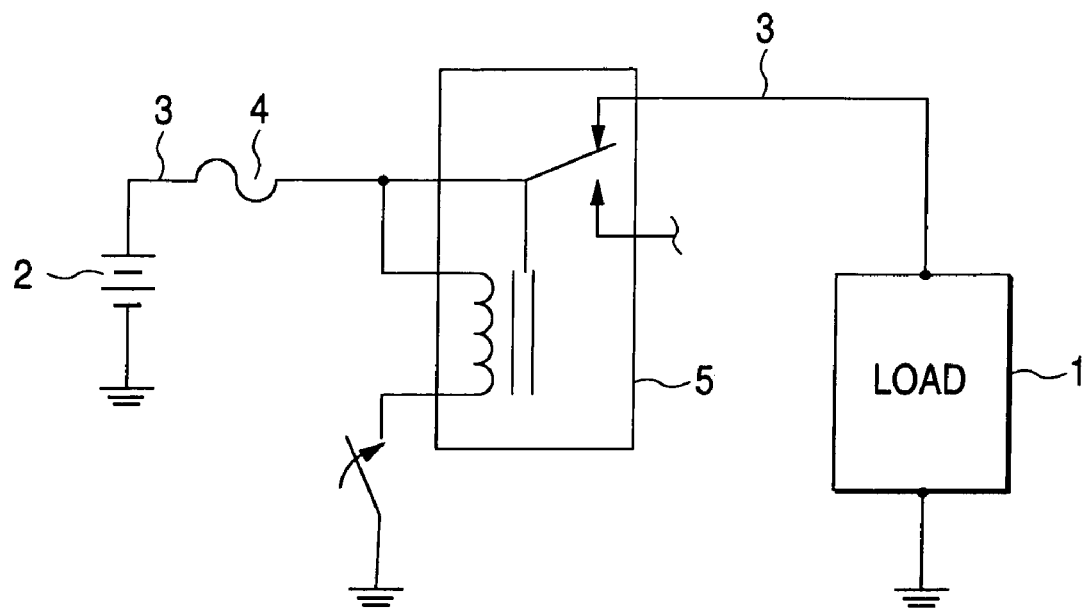
FIG. 2 is a block diagram illustrating a load drive circuit according to conventional technique 1.
Figure 3:
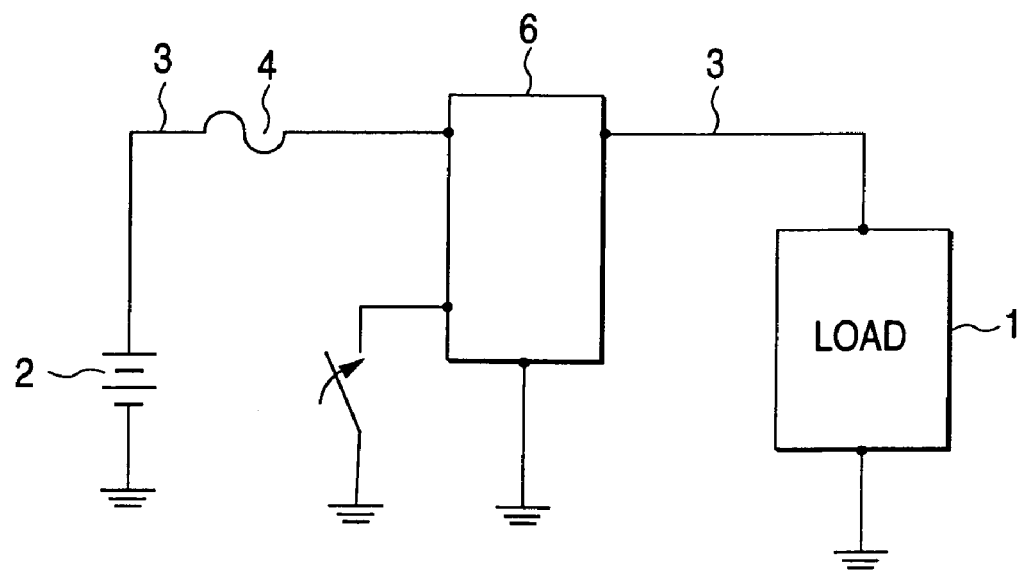
FIG. 3 is a block diagram illustrating a load drive circuit according to conventional technique 2.

FIG. 1 shows a load drive circuit according to one embodiment of the present invention. This embodiment will use the same reference numerals with regards to constituent elements having the same function as those of conventional technique 3 shown in FIG. 4.

Figure 4:
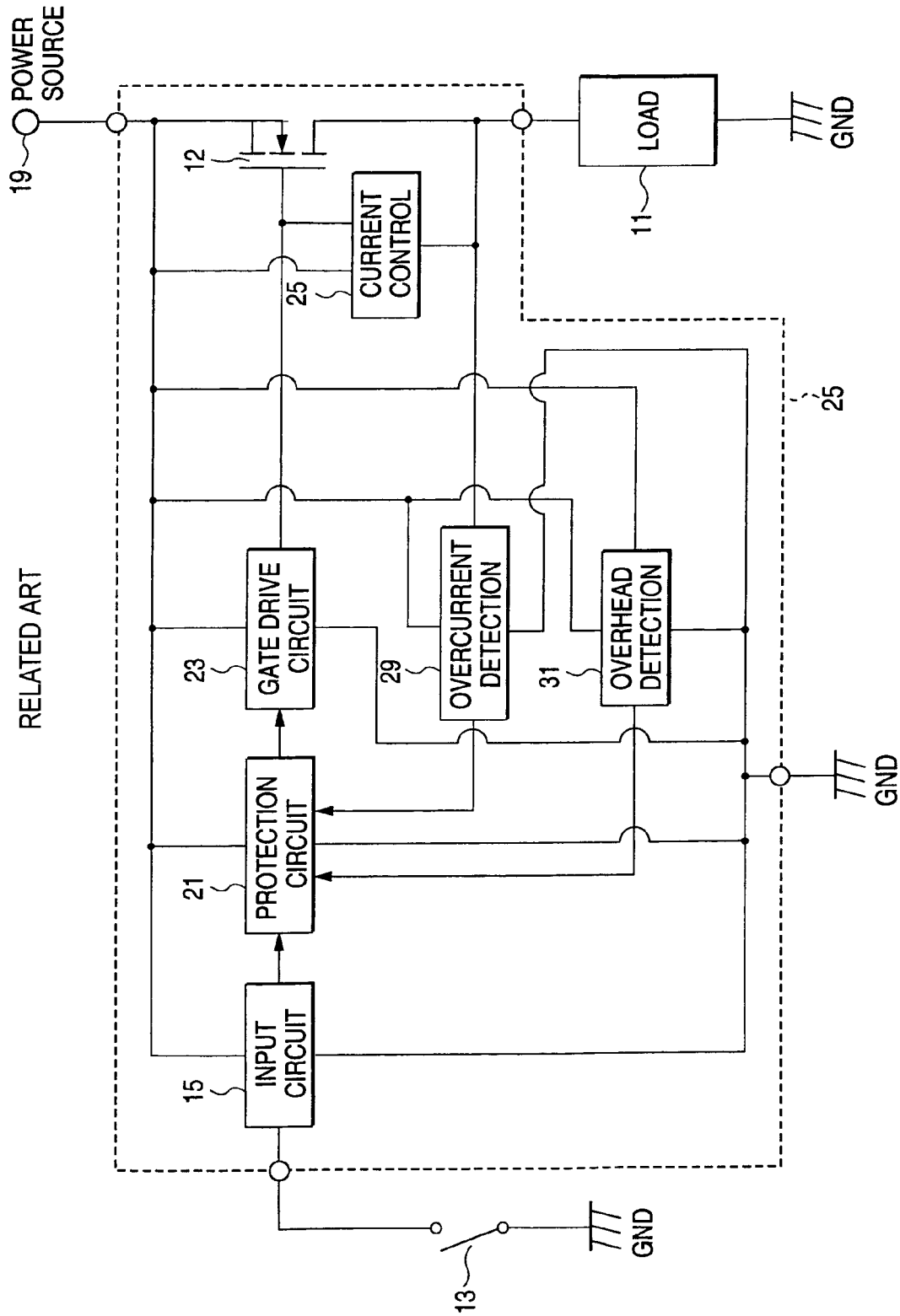
FIG. 4 is a block diagram illustrating a load drive circuit according to conventional technique 3.

This load drive circuit corresponds to the IPD 6 of the conventional technique 3 shown in FIG. 4. As shown in FIG. 1, the load drive circuit includes a switching element that is provided in either of the interspace between the internal control sections 21, 23, 25, 29, and 31 and the power source 19 or the interspace between the control sections 21, 23, 25, 29, and 31 and the ground GND for providing the on/off switching of a current in synchronization with an input signal inputted from the operation switch 13. This allows dark current in the circuit to be blocked as much as possible.

Specifically, this load drive circuit includes: the drive switching element 12 for on/off driving of the load 11; the input circuit 15; the protection circuit 21; the gate drive circuit 23; the current limitation circuit 25; the overcurrent detection circuit 29; the overheat detection circuit 31; and the current blocking switching elements 33 and 34 that are provided at either of power source 19 side or the ground GND side of the circuits 21, 23, 25, 29, and 31 other than the drive switching element 12 and the input circuit 15.

The drive switching element 12 uses a MOS type field-effect transistor (MOS-FET) and switches the two statuses (i.e., one status in which the supply of a driving current to the load 11 is ON and the other status in which the supply is OFF).

The input circuit 15 detects the ON/OFF state of the operation switch 13 in which an operator provides an on/off switching operation with regards to the load 11 to be driver.

The protection circuit 21 operates by being supplied with a power from the power source 19. When the overcurrent detection circuit 29 detects an overcurrent or when the overheat detection circuit 31 detects an overtemperature, then the protection circuit 21 blocks or intermittently stops (chopping), in accordance with intermittent signals from these circuits 29 and 31, the supply of gate voltage to the drive switching element 12 via the gate drive circuit 23, thereby adjusting the drive current and temperature to the load 11.

The gate drive circuit 23 uses a charge pump that uses, in order to allow the gate of the drive switching element 12 to have a higher electric potential than that of the source, an N channel FET and an oscillation capacitor or the like to increase the voltage of the power source 19 (for example, to double the voltage).

When the voltage decline between the drain and the source of the drive switching element 12 exceeds the predetermined threshold value, then the current limitation circuit 25 causes the gate and the source to have therebetween a short circuit to reduce the input voltage to the gate, thereby reducing the current flowing in the drive switching element 12.

The overcurrent detection circuit 29 detects an overcurrent to provide, so long as the overcurrent is continuous and there is intermittent transmission of a predetermined signal to the protection circuit 21.

The overheat detection circuit 31 detects an overtemperature to provide, so long as the overtemperature is continuous and there is intermittent transmission of a predetermined signal to the protection circuit 21.

As shown in FIG. 1, the current blocking switching elements 33 and 34 use a MOS-FET. All of the current blocking switching elements 33 and 34 receive via the common wirings 35 and 36 the gate voltage from the input circuit 15 to provide an on/off switching operation. Specifically, the current blocking switching element 33 is provided as shown in FIG. 1 between the power source-side terminals of the protection circuit 21, the gate drive circuit 23, the current limitation circuit 25, the overcurrent detection circuit 29, and the overheat detection circuit 31 and the power source 19. The current blocking switching element 34 is also provided between the ground-side terminals of the protection circuit 21, the gate drive circuit 23, the overcurrent detection circuit 29, and the overheat detection circuit 31 and the ground GND. Although the load-side terminal of the current limitation circuit 25 has no current blocking switching element, the point P1 between the current limitation circuit 25 and the load 11 may similarly have the current blocking switching element 34, for example. Alternatively, the current blocking switching elements 33 and 34 may not be connected to both of the power source-side terminals and the ground-side terminals of the protection circuit 21, the gate drive circuit 23, the current limitation circuit 25, the overcurrent detection circuit 29, and the overheat detection circuit 31 and may be connected to any of the power source-side terminal and the ground-side terminal, respectively.

Hereinafter, this load drive circuit will be described with regards to the operation.

In addition, when the operation switch 13 is in an OFF state, then the input circuit 15 does not output a gate voltage to the current blocking switching elements 33 and 34 and thus the current blocking switching elements 33 and 34 are in an OFF state. Thus, dark current in the circuit is blocked.

When an operator us s the operation switch 13 to provide an on operation, then the ON/OFF state of the operation switch 13 is detected by the input circuit 15. When the input circuit 15 detects the ON state of the operation switch 13, then this input circuit 15 applies a gate voltage via the common wirings 35 and 36 to gates of the current blocking switching elements 33 and 34. When receiving the gate voltage from the input circuit 15, the current blocking switching elements 33 and 34 switch to an ON state.

Then, power is started to be supplied to the internal control sections 21, 23, 25, 29, and 31 from the power source 19. Thereafter, the load drive circuit uses the self abnormality detection function to protect the overcurrent in the circuit.

Specifically, the input circuit 15 first sends a predetermined trigger signal to the protection circuit 21. Based on the trigger signal, the protection circuit 21 controls so that the gate drive circuit 23 is started to be driven.

In this case, the gate drive circuit (charge pump) 23 increases, in order to allow the gate of the drive switching element 12 to have a higher electric potential than that of the source, the voltage of the power source 19 (for example, to double the voltage).

Then, the current limitation circuit 25 determines whether the voltage drop between both ends of the drive switching element 12 exceeds a predetermined threshold value or not. When the voltage drop between both ends of the drive switching element 12 exceeds the predetermined threshold value, then the current limitation circuit 25 limits the current flowing in the drive switching element 12.

The overcurrent detection circuit 29 detects an overcurrent based on a predetermined standard. When detecting an overcurrent, the overcurrent detection circuit 29 outputs a signal representing the overcurrent to the protection circuit 21.

In accordance with this, the overheat detection circuit 31 detects whether there is an overtemperature or not. When there is an overtemperature, then the overheat detection circuit 31 outputs a signal representing the overtemperature to the protection circuit 21.

When the overcurrent detection circuit 29 detects an overcurrent or when the overheat detection circuit 31 detects an overtemperature, then the protection circuit 21 blocks or intermittently stops via the gate drive circuit 23 the supply of gate voltage to the drive switching element 12 (chopping), thereby adjusting the current and temperature.

When the operator uses the operation switch 13 to provide an off operation again, then the gate voltage from the input circuit 15 to the current blocking switching elements 33 and 34 is stopped, thus allowing the current blocking switching elements 33 and 34 to be in an OFF state. Thereafter, dark current in the circuit is blocked continuously.

In this way, the input OFF state to the input circuit 15 not only causes the gate drive circuit 23 to be in an OFF state to cause the drive switching element 12 to be in an OFF state but also causes via the input circuit 15 the current blocking switching elements 33 and 34 to be in an OFF state. This allows all the circuits other than the input circuit 15 to be blocked, thus blocking dark current flowing in the circuits other than the input circuit 15. This can prevent the battery life from being reduced.

In this case, the input circuit 15 must always detect the operation by the operation switch 13. Thus, a power source to this input circuit 15 must always be in an ON state.

Such a load drive circuit is effectively employed for an intelligent power device used for an electrical component such as an in-vehicle electrical component driven by a battery.

In the load drive circuit of the above-described embodiment, the switching element 33 and 34 for providing the on/off switching of a current in synchronization with an input signal inputted from the operation switch 13 are provided in either of the interspace between all of the control sections 21, 23, 25, 29, and 31 other than the input circuit 15 and the drive switching element 12 and the power source 19 or the interspace between the control sections 21, 23, 25, 29, and 31 and the ground GND. However, another structure also may be provided in which the switching elements 33 and 34 block the dark current of the power source-side or the ground-side of any one or more of the control sections 21, 23, 25, 29, and 31.

The aspects of the invention allows, when the input to the input circuit is in an OFF state, the gate drive circuit to be in an OFF state. This not only causes the drive switching element to be in an OFF state but also causes from the input circuit the current blocking switching elements to be in an OFF state. This allows the control sections other than the input circuit to be blocked, thus allowing dark current flowing in the control section to be blocked. This can prevent the battery life from being reduced.

What is claimed is:

1. A load drive circuit, comprising:
   a drive switching element for switching ON and OFF a load current that is provided between a load and a power source;
   a gate drive circuit for driving ON and OFF the drive switching element;
   an input circuit for detecting an operation state of an external switch;
   a protection circuit for switching, in response to the input circuit detecting the operation state of the external switch as being ON, the gate drive circuit to be in an ON state, and for controlling, in accordance with at least one of an overcurrent status and an overheat status, the gate drive circuit to protect the load drive circuit; and
   a first current blocking switching element for blocking, in response to the input circuit detecting the operation state of the external switch as being OFF, a first current flowing to the gate drive circuit, the first current blocking switching element being provided in at least one of a path between the gate drive circuit and the power source and a path between the gate drive circuit and a ground.

2. The load drive circuit according to claim 1, further comprising:
a second current blocking switching element for blocking, in response to the input circuit detecting the operation state of the external switch as being OFF, a second current flowing to the protection circuit, the second current blocking switching element being provided in at least one of a path between the protection circuit and the power source and a path between the protection circuit and the ground.

3. The load drive circuit according to claim 2, further comprising:
an overcurrent detection circuit for detecting the overcurrent status to output a detection result to the protection circuit; and
a third current blocking switching element for blocking, in response to the input circuit detecting the operation state of the external switch as being OFF, a third current flowing to the overcurrent detection circuit, the third current blocking switching element being provided in at least one of a path between the overcurrent detection circuit and the power source and a path between the overcurrent detection circuit and the ground.

4. The load drive circuit according to claim 2, further comprising:
an overheat detection circuit for detecting the overheat status to output a detection result to the protection circuit; and
a third current blocking switching element for blocking, in response to the input circuit detecting the operation state of the external switch as being OFF, a third current flowing to the overheat detection circuit, the third current blocking switching element being provided in at least one of a path between the overheat detection circuit and the power source and a path between the overheat detection circuit and the ground.

5. The load drive circuit according to claim 3, further comprising:
an overheat detection circuit for detecting the overheat status to output a detection result to the protection circuit; and
a fourth current blocking switching element for blocking, in response to the input circuit detecting the operation state of the external switch as being OFF, a fourth current flowing to the overheat detection circuit, the fourth current blocking switching element being provided in at least one of a path between the overheat detection circuit and the power source and a path between the overheat detection circuit and the ground.

6. The load drive circuit according to claim 1, further comprising:
an overcurrent detection circuit for detecting the overcurrent status to output a detection result to the protection circuit; and
a second current blocking switching element for blocking, in response to the input circuit detecting the operation state of the external switch as being OFF, a second current flowing to the overcurrent detection circuit, the second current blocking switching element being provided in at least one of a path between the overcurrent detection circuit and the power source and a path between the overcurrent detection circuit and the ground.

7. The load drive circuit according to claim 6, further comprising:
an overheat detection circuit for detecting the overheat status to output a detection result to the protection circuit; and
a third current blocking switching element for blocking, in response to the input circuit detecting the operation state of the external switch as being OFF, a third current flowing to the overheat detection circuit, the third current blocking switching element being provided in at least one of a path between the overheat detection circuit and the power source and a path between the overheat detection circuit and the ground.

8. The load drive circuit according to claim 1, further comprising:
an overheat detection circuit for detecting the overheat status to output a detection result to the protection circuit; and
a second current blocking switching element for blocking, in response to the input circuit detecting the operation state of the external switch as being OFF, a second current flowing to the overheat detection circuit, the second current blocking switching element being provided in at least one of a path between the overheat detection circuit and the power source and a path between the overheat detection circuit and the ground.

9. The load drive circuit according to claim 1, further comprising:
a current limitation circuit for limiting, when a voltage drop between both ends of the drive switching element exceeds a predetermined threshold value, the load current flowing in the drive switching element; and
another current blocking switching element for blocking, in response to the input circuit detecting the operation state of the external switch as being OFF, another current flowing to the current limitation circuit, the another current blocking switching element being provided in a path between the current limitation circuit and the power source.

10. A load drive circuit, comprising:
a drive switching element for switching ON and OFF a load current that is provided between a load and a power source;
a gate drive circuit for driving ON and OFF the drive switching element;
an input circuit for detecting an operation state of an external switch;
a protection circuit for switching, in response to the input circuit detecting the operation state of the external switch as being ON, the gate drive circuit to be in an ON state, and for controlling, in accordance with at least one of an overcurrent status and an overheat status, the gate drive circuit to protect the load drive circuit; and
a first current blocking switching element for blocking, in response to the input circuit detecting the operation state of the external switch as being OFF, a first current flowing to the protection circuit, the first current blocking switching element being provided in at least one of a path between the protection circuit and the power source and a path between the protection circuit and a ground.

11. The load drive circuit according to claim 10, further comprising:

an overcurrent detection circuit for detecting the overcurrent status to output a detection result to the protection circuit; and a second current blocking switching element for blocking, in response to the input circuit detecting the operation state of the external switch as being OFF, a second current flowing to the overcurrent detection circuit, the second current blocking switching element being provided in at least one of a path between the overcurrent detection circuit and the power source and a path between the overcurrent detection circuit and the ground.

12. The load drive circuit according to claim 11, further comprising:

an overheat detection circuit for detecting the overheat status to output a detection result to the protection circuit; and a third current blocking switching element for blocking, in response to the input circuit detecting the operation state of the external switch as being OFF, a third current flowing to the overheat detection circuit, the third current blocking switching element being provided in at least one of a path between the overheat detection circuit and the power source and a path between the overheat detection circuit and the ground.

13. The load drive circuit according to claim 10, further comprising:

an overheat detection circuit for detecting the overheat status to output a detection result to the protection circuit; and a second current blocking switching element for blocking, in response to the input circuit detecting the operation state of the external switch as being OFF, a second current flowing to the overheat detection circuit, the second current blocking switching element being provided in at least one of a path between the overheat detection circuit and the power source and a path between the overheat detection circuit and the ground.

14. A load drive circuit, comprising:

a drive switching element for switching ON and OFF a load current that is provided between a load and a power source;

a gate drive circuit for driving ON and OFF the drive switching element;

an input circuit for detecting an operation state of an external switch;

a protection circuit for switching, in response to the input circuit detecting the operation state of the external switch as being ON, the gate drive circuit to be in an ON state, and for controlling, in accordance with at least one of an overcurrent status and an overheat status, the gate drive circuit to protect the load drive circuit;

an overcurrent detection circuit for detecting the overcurrent status to output a detection result to the protection circuit; and a current blocking switching element for blocking, in response to the input circuit detecting the operation state of the external switch as being OFF, a current flowing to the overcurrent detection circuit, the current blocking switching element being provided in at least one of a path between the overcurrent detection circuit and the power source and a path between the overcurrent detection circuit and a ground.

15. The load drive circuit according to claim 14, further comprising:

an overheat detection circuit for detecting the overheat status to output a detection result to the protection circuit; and another current blocking switching element for blocking, in response to the input circuit detecting the operation state of the external switch as being OFF, another current flowing to the overheat detection circuit, the another current blocking switching element being provided in at least one of a path between the overheat detection circuit and the power source and a path between the overheat detection circuit and the ground.

16. A load drive circuit, comprising:

a drive switching element for switching ON and OFF a load current that is provided between a load and a power source;

a gate drive circuit for driving ON and OFF the drive switching element;

an input circuit for detecting an operation state of an external switch;

a protection circuit for switching, in response to the input circuit detecting the operation state of the external switch as being ON, the gate drive circuit to be in an ON state, and for controlling, in accordance with at least one of an overcurrent status and an overheat status, the gate drive circuit to protect the load drive circuit;

an overheat detection circuit for detecting the overheat status to output the detection result to the protection circuit; and a current blocking switching element for blocking, in response to the input circuit detecting the operation state of the external switch as being OFF, a current flowing to the overheat detection circuit, the current blocking switching element being provided in at least one of a path between the overheat detection circuit and the power source and a path between the overheat detection circuit and a ground.

17. A load drive circuit, comprising:

a drive switching element for switching ON and OFF a load current that is provided between a load and a power source;

a gate drive circuit for driving ON and OFF the drive switching element;

an input circuit for detecting an operation state of an external switch;

a protection circuit for switching, in response to the input circuit detecting the operation state of the external switch as being ON, the gate drive circuit to be in an ON state, and for controlling, in accordance with at least one of an overcurrent status and an overheat status, the gate drive circuit to protect the load drive circuit;

a current limitation circuit for limiting, when a voltage drop between both ends of the drive switching element exceeds a predetermined threshold value, the load current flowing in the drive switching element; and a current blocking switching element for blocking, in response to the input circuit detecting the operation state of the external switch as being OFF, a current flowing to the current limitation circuit, the current blocking switching element being provided in a path between the current limitation circuit and the power source.

18. A load drive circuit, comprising:

a drive switching element for switching ON and OFF a load current that is provided between a load and a power source;

a plurality of control sections for drive controlling of the drive switching element while protecting the drive switching element from a predetermined abnormality status; and an input circuit for detecting an operation state of an external switch;

a current blocking switching element for blocking, in response to the input circuit detecting the operation state of the external switch as being OFF, a current flowing to the control sections, the current blocking switching element being provided in at least one of a path between at least one of the control sections and the power source and a path between the at least one of the control sections and a ground.

* * * * *